(12) United States Patent
Krassnitzer et al.

(10) Patent No.: US 9,601,316 B2
(45) Date of Patent: Mar. 21, 2017

(54) IGNITION APPARATUS FOR ARC SOURCES

(71) Applicant: Oerlikon Trading AG, Trubbach, Trubbach (CH)

(72) Inventors: Siegfried Krassnitzer, Feldkirch (AT); Oliver Gstoehl, Balzers (LI); Juerg Hagmann, Sax (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 0 days.

(21) Appl. No.: 13/963,128

(22) Filed: Aug. 9, 2013

(65) Prior Publication Data

US 2014/0048209 A1 Feb. 20, 2014

Related U.S. Application Data

(63) Continuation of application No. 13/127,489, filed as application No. PCT/EP2009/007227 on Oct. 8, 2009, now abandoned.

(30) Foreign Application Priority Data

Nov. 12, 2008 (DE) .......................... 10 2008 057 020

(51) Int. Cl.
*H01J 37/32* (2006.01)
*C23F 1/08* (2006.01)

(52) U.S. Cl.
CPC .............. *H01J 37/32* (2013.01); *C23F 1/08* (2013.01); *H01J 37/32009* (2013.01); *H01J 37/32055* (2013.01)

(58) Field of Classification Search
USPC ................................................ 204/298.41
See application file for complete search history.

(56) References Cited

U.S. PATENT DOCUMENTS

| | | | |
|---|---|---|---|
| 4,902,931 A | 2/1990 | Veltrop et al. | |
| 6,413,387 B1* | 7/2002 | Shi et al. | 204/192.38 |
| 2004/0134771 A1* | 7/2004 | Setoyama et al. | 204/192.38 |
| 2007/0187229 A1* | 8/2007 | Aksenov et al. | 204/192.38 |

FOREIGN PATENT DOCUMENTS

| | | |
|---|---|---|
| DE | 69006593 T2 | 6/1994 |
| DE | 19522331 A1 | 1/1996 |
| EP | 1267384 A2 | 12/2002 |
| WO | 2008/125397 A1 | 10/2008 |

OTHER PUBLICATIONS

International Search Report for PCT/EP2009/007227 dated Jan. 19, 2010.

* cited by examiner

*Primary Examiner* — Stefanie S Wittenberg
(74) *Attorney, Agent, or Firm* — Pearne & Gordon LLP

(57) ABSTRACT

The present invention relates to an ignition device for igniting a high-current discharge of an electrical arc evaporator in a vacuum coating system. Ignition is performed by means of mechanically closing and opening a contact between the cathode and the anode. Contact is established by means of an ignition finger that can move on a forced path. On account of the forced path, the ignition finger can be moved by means of a simple mechanical drive to a park position, which is protected against coating, and said ignition finger can also be used to ignite a second target.

9 Claims, 3 Drawing Sheets

IGNITION APPARATUS FOR ARC SOURCES

RELATED APPLICATIONS

The present application is a continuation in the USA of international PCT patent application No WO2009EP007227, filed on 8 Oct. 2009 and published under No WO2010054726 on 20 May 2010, which claims priority from German patent application No DE102008057020.6 of 12 Nov. 2008; the contents of these applications are incorporated herewith by reference.

FIELD OF THE INVENTION

The present invention relates to an ignition device for igniting a high-current discharge of an electrical arc evaporator in a vacuum coating system according to the preamble of claim 1.

An arc evaporator as mentioned above, also called arc source or spark source, is used for treating work-pieces under high vacuum, in particular for plasma etching and/or for coating.

STATE OF THE ART

Ignition devices for arc evaporation sources can essentially be divided into 3 groups:
a) Mechanical closing and opening of a contact between the cathode and the anode, wherein the current is limited typically to approx. 5 A by means of a pre-resistance. Such a mechanism is represented in FIG. 1. A stroke movement brings the fingertip of a trigger finger 7 into contact with the cathode 5 and the electric circuit is thus closed. In FIG. 1, the electric circuit is represented in a dotted line. The generator 3 is located in the open-circuit at an open-circuit voltage of typically 60-120V. The current passing through the trigger finger 7 is limited by the resistance 9 to a value on the order of approx. 5 A. By releasing the electric circuit by means for example of a further stroke movement, by which the fingertip is removed from the cathode, a spark is generated at the cathode surface. This is the initial plasma that is propagated by the extremely dynamic generator 3. The corresponding electric circuit is drawn in a dashed line.
b) Ignition of the arc discharge through an electric sparkover
This is achieved for example by means of a device according to FIG. 2. In this case, an electric sparkover generated by means of a high-voltage pulse from a pulse generator 13 generates an initial spark on the target 5. The electric circuit driven by the pulse generator is illustrated in a dotted line. The initial spark is propagated through the arc power supply 3. The corresponding electric circuit is drawn in a dashed line. The output stage of the arc power supply must generally be protected by a circuit 11 from the high-voltage pulse.
c) Ignition through an electrically conducting bridge
This is achieved for example by means of a device according to FIG. 3. While the arc source is in operation, an isolator 17 placed between the anode and the cathode 5 is coated. In case a conductive layer is coated, a resistor bridge 15 is created between the cathode and the anode. Through a high-voltage pulse (up to approx. 500V) overlaying the arc supply, a current is conducted over this resistance from the cathode to the anode and causes the conductive layer 19 to melt locally. The arc discharge is thus ignited. This conductive layer is continually renewed during the operation of the source. In the case of a virgin source, the process is initialized by application of a silver layer. However, this method does not work for evaporating isolating layers.

So far, methods have been described that merely allow the spark at a cathode resp. a target to be ignited. A device is known from the prior art that provides, in addition to the stroke movement, also a rotation movement of the trigger finger. By means of the rotation movement, the trigger finger can be redirected from a first target onto at least a further target.

Such a device is disclosed in U.S. Pat. No. 6,998,034, which discloses a rotatable and displaceable trigger finger for igniting one or several arc sources. In the arrangement disclosed therein, a rotation movement and a stroke movement make it possible to switch from the target 1 to a target N (up to four targets, in the example). The disadvantage is however that a complex drive design is required.

It would therefore be desirable to have an ignition device that can be used on several targets on the basis of the mechanical opening and closing of a contact and which can do without a complex drive design.

BRIEF DESCRIPTION OF THE INVENTION

It is therefore a task of the present invention to propose an ignition device that can be found in the group comprising the mechanical closing and opening of a contact, that is designed for several targets and/or wherein the contact part used for ignition is protected from coating during the coating process. In this connection, a trigger finger is provided that is movable in such a fashion that a movement of the fingertip is essentially possible only on a forced path, wherein the forced path of each of the targets to be ignited is touched and/or crossed in at least one point. The fingertip in this case is the contact part used for ignition. According to the invention, the latter can be moved after ignition along the forced path to a park position far away from the impact area of the target, so that it is essentially not coated during the coating process. As the fingertip is not coated, longer lifetimes can be achieved. Furthermore, the reliability of the ignition is increased considerably. This applies particularly for processes in which isolating layers and in particular oxide layers are coated.

In a first embodiment, the trigger finger is mounted on a rotation axis and the rotation axis is placed at a tilt between the targets, so that when the rotation axis is rotated, the fingertip is moved along a circular segment, with the plane of the circular segment crossing the plane in which the two targets are placed.

In a second embodiment, the trigger finger is directed linearly along a slotted element. The slotted element causes the fingertip to descend onto the corresponding target as well as the fingertip to rise up from the target.

A third embodiment of the present invention represents a combination of the first embodiment and of the second embodiment. This means that the finger is again mounted on a rotation axis. It is however mounted in a movable fashion relative to this rotation axis so that it can be rotated around the axis perpendicularly to the rotation axis and perpendicularly to the axis of the finger. This rotation is, however, in turn limited through a slotted element. When the rotation axis is rotated, the fingertip moves according to the prescribed rotation and according to the requirements of the slotted element.

DETAILED DESCRIPTION OF THE INVENTION

The invention will now be explained by way of example on the basis of the figures and by means of different embodiments.

Figure 1:
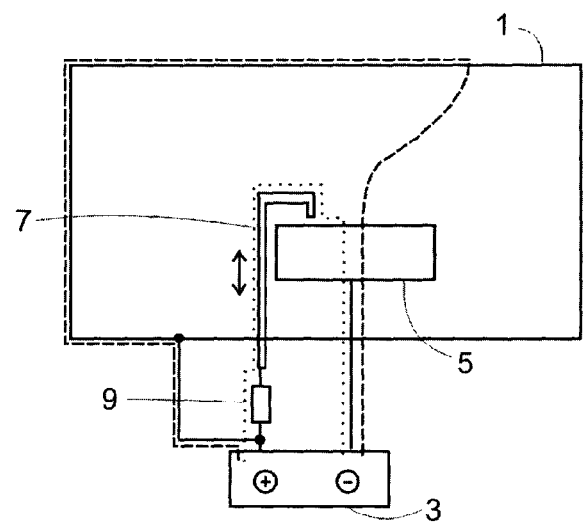
FIG. 1 shows an arc evaporator with an ignition device according to prior art.
Figure 2:
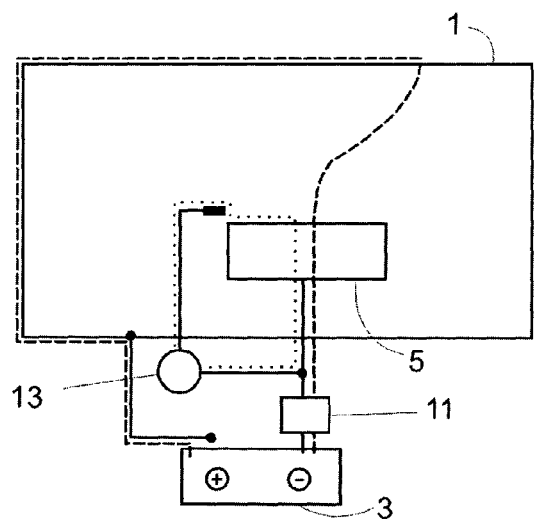
FIG. 2 shows an arc evaporator with another ignition device based on electrical sparkover according to prior art.
Figure 3:
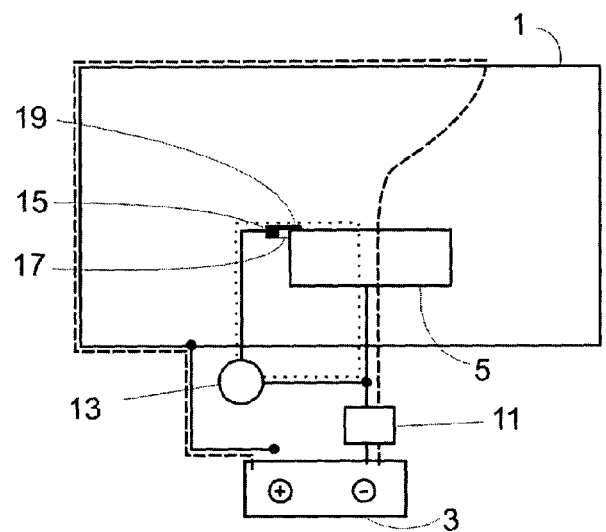
FIG. 3 shows an arc evaporator with another ignition device based on electrical conducting bridge according to prior art.

FIGS. 1 to 3 show prior art embodiments. They are described under the section "state of the art".

Figure 4:
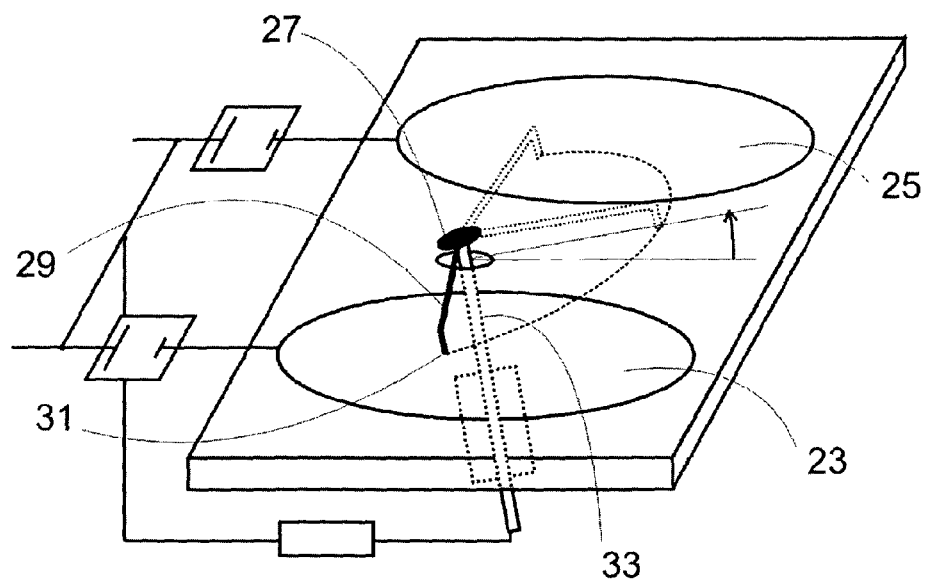
FIG. 4 shows a preferred first embodiment according to the present invention.

FIG. 4 shows a first embodiment of the present invention with part of a vacuum chamber 21 on which two targets 23, 25 are provided essentially in a first plane. Additionally, an ignition device 27 with a trigger finger 29 and fingertip 31 is provided. The ignition device further comprises an axle 33 on which the trigger finger 29 is fixedly placed. According to the invention, the axis of the axle 33 forms with the normal on the first plane an angle different from zero, so that the arc of circle on which the fingertip 31 moves when the axle 33 rotates lies in a plane that crosses the plane defined by the target in the region of the target. Thus the fingertip 31 of the trigger finger 29 can be moved in reversible fashion from the one target surface 23 to the other target surface 25.

Thanks to the tilted axle 33, the trigger finger can establish a contact on the target surface solely by a rotation movement. In the represented embodiment, the ignition device is symmetrical in its function and can thus be used for two arc sources (targets) placed next to one another. One particular advantage is that the trigger finger 29, after a successful ignition, can be rotated to a park position outside the target area, at the zenith of the arc of circle. The trigger finger is thus only negligibly soiled during the coating operation of the arc sources, which enables a long lifetime without cleaning. A further advantage of this embodiment is that the trigger points, i.e. the points at which the fingertip 31 touches the surfaces of the targets 23, 25, are reached automatically by swiveling the trigger finger. It is thus not necessary to adjust the distances or the stroke movement when the target surfaces changes, in particular through target erosion due to the coating process.

Figure 5:
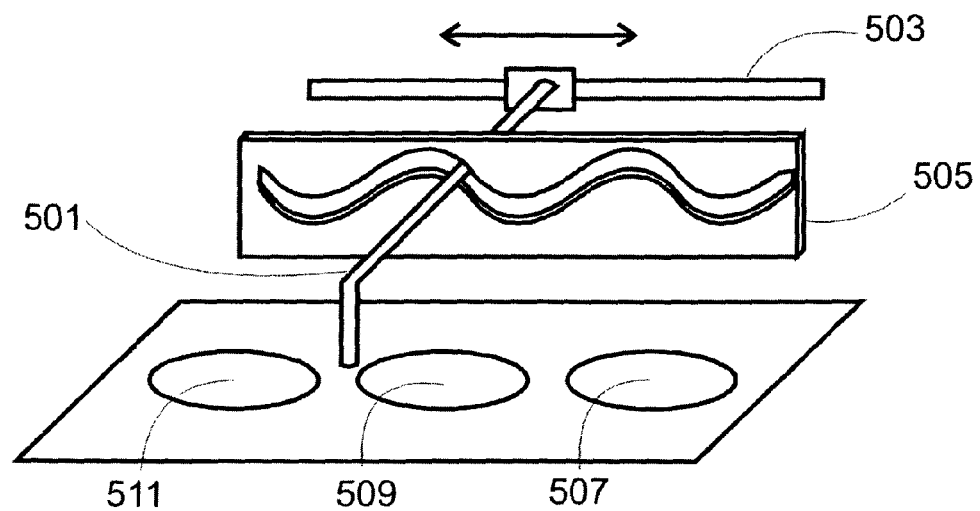
FIG. 5 shows a preferred second embodiment according to the present invention.

FIG. 5 shows a second embodiment of the present invention. A trigger finger 501 is in this case mounted on a rail 503 in a movable fashion so that it can be moved along the rail. Furthermore, the trigger finger could be rotated around the rail 503 if the slotted element 505 were not there to make the trigger finger move on a forced path when it is displaced along the rail 503. Three targets 507, 509, 511 are also shown in FIG. 5. The slotted element 505 is designed in such a manner that when the trigger finger 501 is displaced along the rail 503, the path of the fingertip touches the surface of the respective target. The one skilled in the art will understand that this embodiment can be expanded to any number of targets. The added advantage is that the trigger finger 501, after a successful ignition, can be moved into a park position outside the target area.

Figure 6:
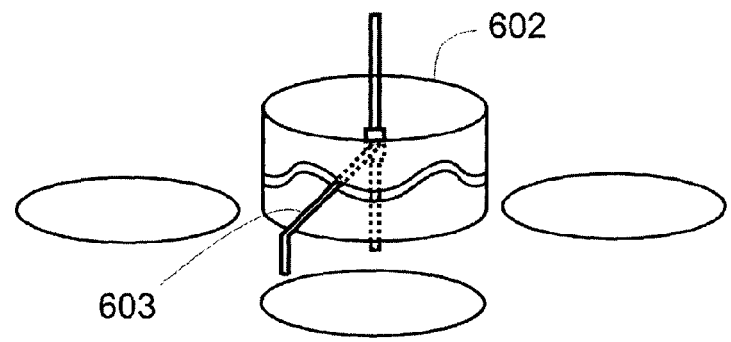
FIG. 6 shows a preferred third embodiment according to the present invention.

FIG. 6 shows a further embodiment of the present invention, which represents in a certain manner a combination of the first and of the second embodiments. The slotted element mentioned in the second embodiment is formed here into a cylindrical sleeve 601. The trigger finger 603 can be rotated around an axis parallel to the cylinder's axis and essentially in the cylinder's center-point. The trigger finger is guided on a forced path by the slotted element of the sleeve.

The invention has been described on the basis of examples with several targets. It must however be noted that the aspect of moving the ignition finger into a protected park position before coating can also be used with advantage in the case where only one target is to be ignited with the ignition finger.

LIST OF REFERENCES

1 Vacuum chamber
3 Generator
5 Cathode resp. target
7 Trigger finger
9 Resistance
11 Protective electric circuit
13 Pulse generator
15 Resistance bridge
17 Insulator
19 Conductive layer
21 Part of the vacuum chamber
23 Target
25 Target
27 Ignition device
29 Trigger finger
31 Fingertip
33 Axle
501 Trigger finger
503 Rail
505 Slotted element
507 Target
509 Target
511 Target
601 Sleeve
603 Trigger finger

The invention claimed is:
1. An arc source, comprising:
a first target;
a second target, the first and second targets being positioned substantially in a first plane; and
an ignition device provided for igniting a spark at the first target and at the second target,
wherein the ignition device comprises a trigger finger that is mounted movably such that a moving means is provided for moving a fingertip of the trigger finger towards a surface of the first target and towards a surface of the second target,
wherein the moving means comprises a rotary drive and a shaft,
wherein the rotary drive cooperates with a guide means to drive the fingertip such that, when driven, the fingertip moves on a forced path that at least one of touches and intersects both targets,
wherein the trigger finger is arranged movably on the shaft such that the height of the fingertip, defined by the vertical projection of the fingertip to the shaft, is variable, the height of the fingertip being dependent upon a rotation of the trigger finger about the shaft, and wherein the guide means is formed as a sliding block guide spaced radially from the shaft, the sliding block guide comprising a cylindrical sleeve having a slotted element through which the trigger finger extends, the slotted element being configured to define the variable height of the fingertip.

2. An arc source, comprising:

a first target;

a second target, the first and second targets being positioned substantially in a first plane; and an ignition device provided for igniting a spark at the first target and at the second target, wherein the ignition device comprises a trigger finger that is mounted movably such that a moving means is provided for moving a fingertip of the trigger finger towards a surface of the first target and towards a surface of the second target, wherein the moving means comprises a linear drive, wherein the linear drive cooperates with a guide means to drive the fingertip such that, when driven, the fingertip moves on a forced path that at least one of touches and intersects both targets, wherein the moving means comprises a rail on which the trigger finger is mounted in a linearly movable manner, the trigger finger being configured to move along the rail, and wherein the guide means is formed as a sliding block guide, the sliding block guide comprising a slotted element configured to define a variable height of the fingertip, the trigger finger extending from the rail through the slotted element to the fingertip of the trigger finger.

3. A device for treating workpieces in a vacuum comprising an arc source according to claim 1.

4. A device according to claim 3 that is a coating plant.

5. A device according to claim 4 that is a plasma etching plant.

6. A device for treating workpieces in a vacuum comprising an arc source according to claim 2.

7. A device according to claim 6 that is a coating plant.

8. A device according to claim 7 that is a plasma etching plant.

9. The arc source according to claim 1, wherein the slotted element is positioned in a circumference of the cylindrical sleeve that is spaced radially from the shaft, the slot being arranged to vary the height of the fingertip as the trigger finger rotates on the shaft around an axis parallel to an axis of the cylindrical sleeve.

* * * * *